US009570173B2

(12) United States Patent
Yoshihara et al.

(10) Patent No.: US 9,570,173 B2
(45) Date of Patent: Feb. 14, 2017

(54) SEMICONDUCTOR STORAGE DEVICE AND MEMORY SYSTEM

(71) Applicant: Kabushiki Kaisha Toshiba, Minato-ku (JP)

(72) Inventors: Masahiro Yoshihara, Yokohama (JP); Naofumi Abiko, Kawasaki (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 15/062,683

(22) Filed: Mar. 7, 2016

(65) Prior Publication Data

US 2016/0189777 A1 Jun. 30, 2016

Related U.S. Application Data

(63) Continuation of application No. PCT/JP2014/072061, filed on Aug. 22, 2014.

(30) Foreign Application Priority Data

Sep. 11, 2013 (JP) ................................ 2013/074579

(51) Int. Cl.
*G11C 16/04* (2006.01)
*G11C 16/26* (2006.01)
(Continued)

(52) U.S. Cl.
CPC ....... *G11C 16/0483* (2013.01); *G11C 11/5642* (2013.01); *G11C 16/08* (2013.01); *G11C 16/26* (2013.01)

(58) Field of Classification Search
CPC . G11C 16/0483; G11C 16/26; G11C 11/5642; G11C 16/08
See application file for complete search history.

(56) References Cited

U.S. PATENT DOCUMENTS 7,522,454 B2 * 4/2009 Li .......................... G11C 7/02
365/185.17
2011/0305089 A1 12/2011 Abe et al.
(Continued)

FOREIGN PATENT DOCUMENTS

CN 102142279 A 8/2011
JP 2011-159355 8/2011
(Continued)

OTHER PUBLICATIONS

International Search Report issued Nov. 4, 2014 in PCT/JP2014/072061 filed on Aug. 22, 2014.
(Continued)

*Primary Examiner* — Richard Elms
*Assistant Examiner* — Ajay Ojha
(74) *Attorney, Agent, or Firm* — Oblon, McClelland, Maier & Neustadt, L.L.P.

(57) ABSTRACT

A semiconductor storage device has a memory string including a memory cell, a bit line electrically connected to one end of the memory string, and a sense amplifier electrically connected to the bit line. The sense amplifier has a first transistor, one end of which is connected to a first node on an electric current path of the bit line, and another end of which is electrically connected to a second node, a second transistor electrically connected between the second node and a sense node, and a third transistor, a gate of which is connected to the first node, and the third transistor being electrically connected between the second node and a third node whose voltage can be adjusted.

20 Claims, 15 Drawing Sheets

(51) Int. Cl.
*G11C 11/56* (2006.01)
*G11C 16/08* (2006.01)

(56) References Cited

U.S. PATENT DOCUMENTS

| | | |
|---|---|---|
| 2013/0003454 A1 | 1/2013 | Edahiro et al. |
| 2013/0070528 A1 | 3/2013 | Maeda |
| 2013/0286738 A1 | 10/2013 | Kamata |
| 2014/0003154 A1 | 1/2014 | Abe et al. |

FOREIGN PATENT DOCUMENTS

| | | |
|---|---|---|
| JP | 2011-181157 | 9/2011 |
| JP | 2011-258289 | 12/2011 |
| JP | 2013-12267 | 1/2013 |
| JP | 2013-69356 | 4/2013 |
| JP | 2013-232258 | 11/2013 |
| JP | 2014-10875 | 1/2014 |

OTHER PUBLICATIONS

Singaporean Written Opinion issued Jun. 17, 2016 in Patent Application No. 11201601737S.
English translation of the International Preliminary Report on Patentability and Written Opinion issued on Mar. 24, 2016 in PCT/JP2014/072061 filed on Aug. 22, 2014.

\* cited by examiner

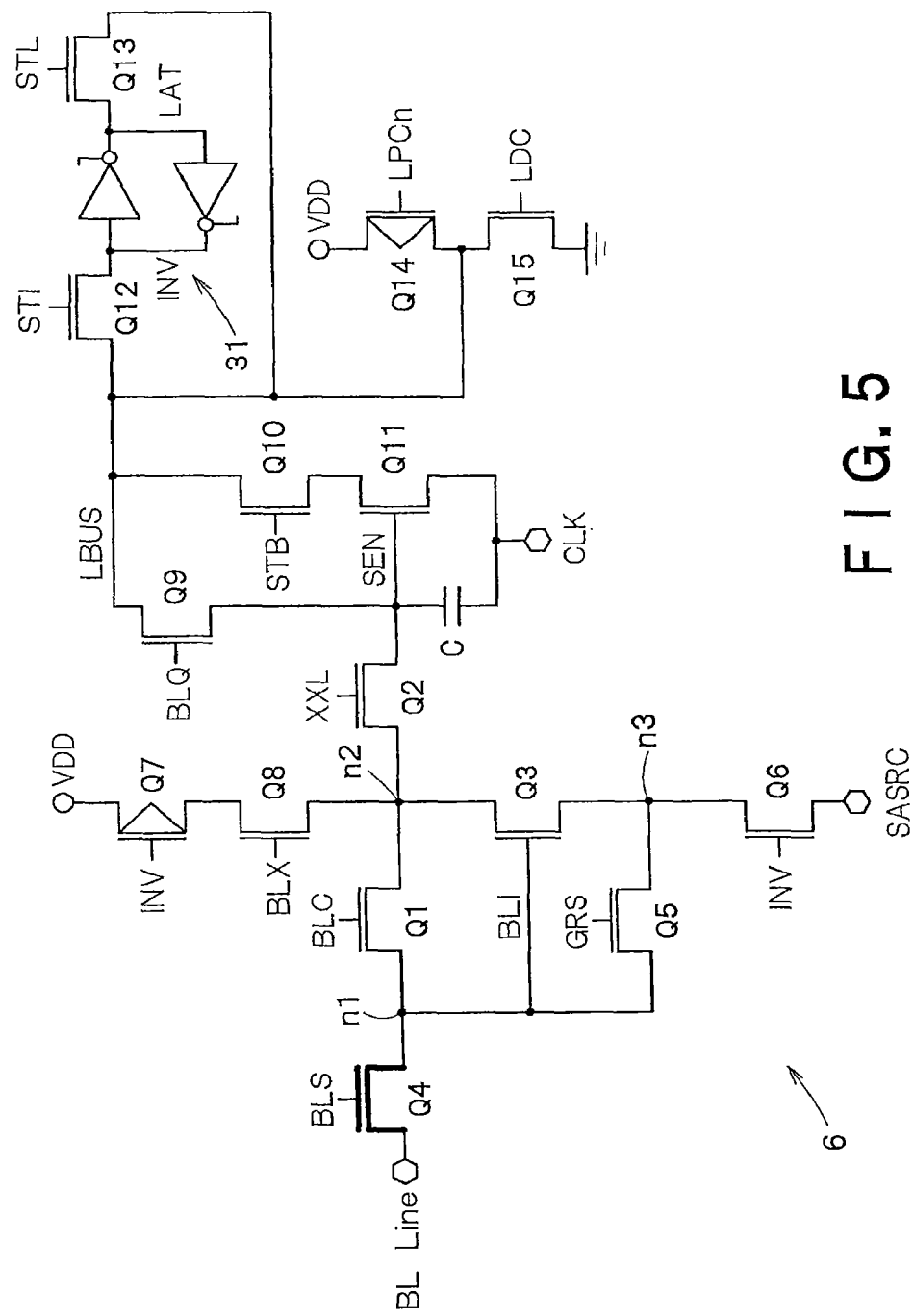
F I G. 5

SEMICONDUCTOR STORAGE DEVICE AND MEMORY SYSTEM

CROSS REFERENCE TO RELATED APPLICATIONS

This application is based upon and claims the benefit of priority from the PCT Application No. PCT/JP2014/072061, filed on Aug. 22, 2014, the entire contents of which are incorporated herein by reference.

FIELD

Embodiments herein relate to a semiconductor storage device and a memory system.

BACKGROUND

A NAND-type flash memory has been known as a nonvolatile semiconductor storage device.

BRIEF DESCRIPTION OF THE DRAWINGS

FIG. 5 is a circuit diagram of a sense amplifier 6 according to a second embodiment;

DETAILED DESCRIPTION

According to one embodiment, a semiconductor storage device has:

a memory string including a memory cell;
a bit line electrically connected to one end of the memory string; and
a sense amplifier electrically connected to the bit line, wherein
the sense amplifier has:
a first transistor, one end of which is connected to a first node on an electric current path of the bit line, and another end of which is electrically connected to a second node;
a second transistor electrically connected between the second node and a sense node; and
a third transistor, a gate of which is connected to the first node, and the third transistor being electrically connected between the second node and a third node whose voltage can be adjusted.

Hereinafter, several embodiments will be described with reference to the drawings.

An all bit line (ABL) manner has been known as one of sensing manners. The ABL manner precharges bit lines and then flows an electric current to all of the bit lines within one column to make electric potentials of the respective bit lines constant. In this condition, read data from a memory cell is detected based on an amount of the electric current flowing from the bit line.

However, a sense amplifier in the ABL manner has a problem in that an operation voltage thereof is high. Low electric power consumption is highly required in a portable electronic device such as a smartphone and thus a semiconductor storage device is desired to stably operate even when a power supply voltage is lowered.

For example, in a case where a NAND-type flash memory is driven with a low voltage, it is necessary to reduce a CELSRC voltage applied to one end of a NAND string as the power supply voltage is lowered. However, reducing the CELSRC voltage deteriorates a data retention rate during writing, resulting in a risk of a decrease in the reliability of the memory cell. For this reason, it is not easy to reduce the CELSRC voltage, which has made low-voltage driving difficult as a result. The embodiments described below are characterized by being capable of driving with a low voltage.

Figure 1:
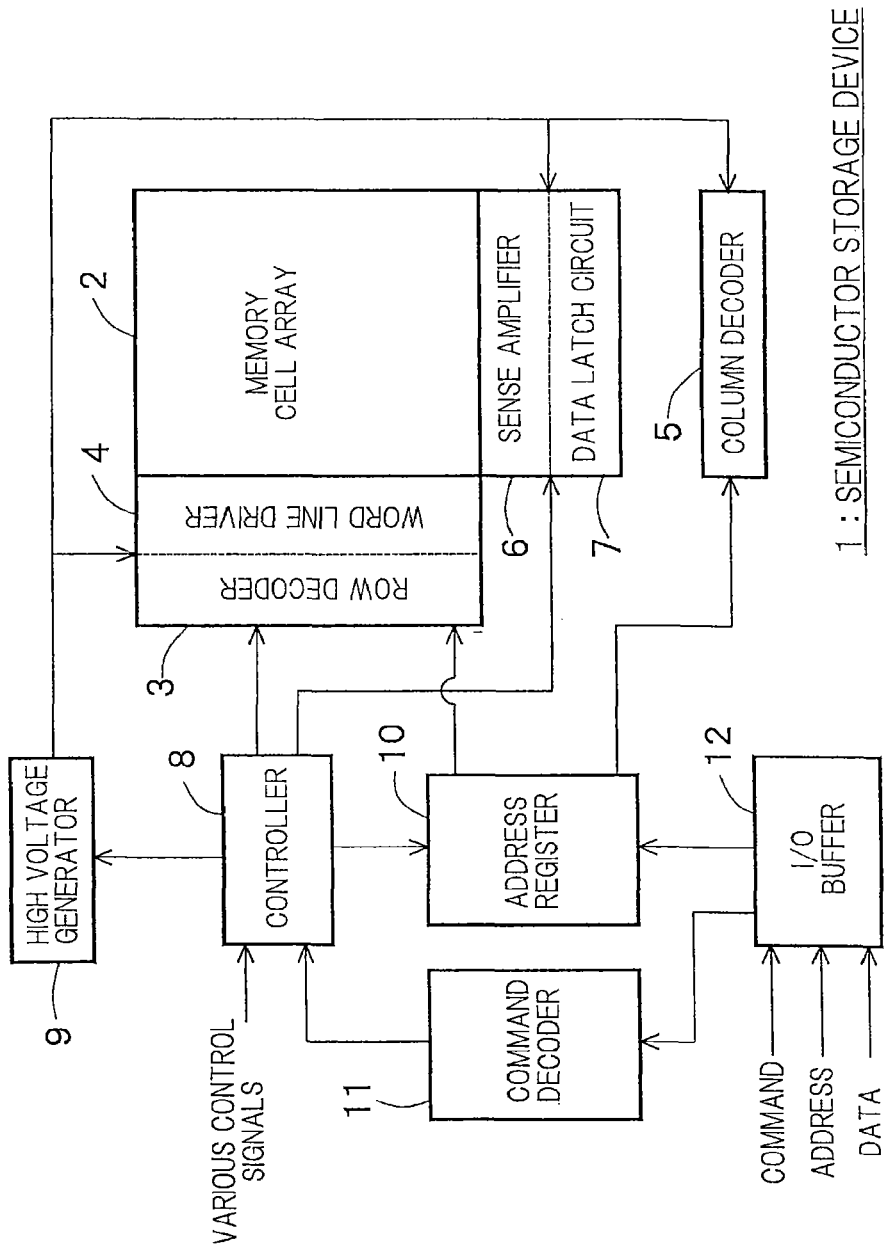
FIG. 1 is a block diagram illustrating a schematic configuration of a semiconductor storage device 1 according to an embodiment of the present invention.

FIG. 1 is a block diagram illustrating a schematic configuration of a semiconductor storage device 1 according to an embodiment of the present invention. The semiconductor storage device 1 in FIG. 1 depicts an example of the NAND-type flash memory.

The semiconductor storage device 1 in FIG. 1 includes a cell array 2, a row decoder 3, a word line driver 4, a column decoder 5, a sense amplifier (S/A) 6, a data latch circuit 7, a controller 8, a high voltage generation unit (high voltage generation circuitry) 9, an address register 10, a command decoder 11, an I/O buffer 12.

Figure 2:
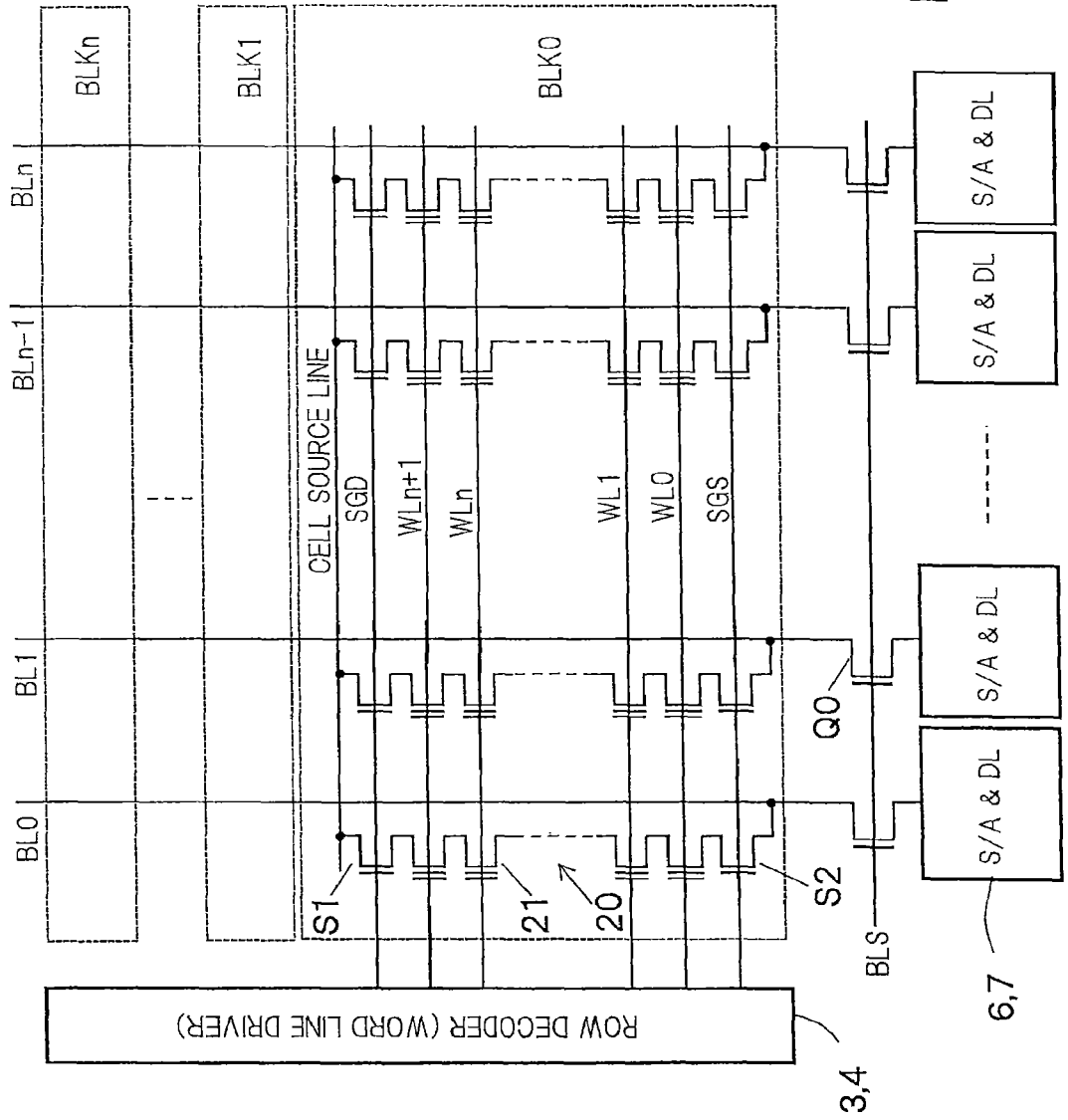
FIG. 2 is a block diagram illustrating a detailed configuration of the periphery of a cell array 2.

In the cell array 2, a NAND string 20 in which the plurality of memory cells are serially connected is connected to each of the bit lines. FIG. 2 is a block diagram illustrating a detailed configuration of the periphery of the cell array 2. As illustrated in FIG. 2, the cell array 2 is divided into a plurality of blocks BLK0 to BLKn−1. The plurality of NAND strings 20 described above is arrayed in a column direction in each of the blocks. Each of the NAND strings 20 includes a plurality of memory cells 21 connected serially, a select gate transistor S1 connected on one end side of these memory cells 21, and a select gate transistor S2 connected on another end side thereof.

Gates of the respective memory cells 21 within the NAND string 20 are connected to corresponding word lines WL0 to WLn−1. A gate of the select gate transistor S1 is connected to a select gate line SGD. A gate of the select gate transistor S2 is connected to a select gate line SGS. The respective NAND strings 20 are connected to a common cell source line through the corresponding select gate transistors S1. In addition, the respective NAND strings 20 are connected to corresponding bit lines BL0 to BLn−1 through the corresponding select gate transistors S2. Both of the number of the blocks and the number of the word lines can be arbitrarily set.

The respective word lines WL0 to WLn−1 connected to the gates of the respective memory cells 21 within the NAND string 20 are connected to the row decoder 3. The row decoder 3 decodes a row address transferred from the address register 10. The word line driver 4 is disposed in the vicinity of the row decoder 3. Based on the decoded data, the word line driver 4 generates voltages to drive the respective word lines.

The bit lines BL0 to BLn connected to the respective NAND strings 20 are connected to the sense amplifiers 6 through bit line select transistors Q0. As will be described later, the sense amplifier 6 according to the embodiment is capable of using the all bit line (ABL) manner for sensing. In addition to this, a new manner (hereinafter, referred to as diode sense ABL (DSA) manner) can be used as well for the sensing thereby. In any case where one of the manners is employed, the sense amplifier 6 detects read data from the memory cell 21 in accordance with an amount of an electric current flowing from the bit line. The read data detected by the sense amplifier 6 is retained in the data latch circuit 7 as, for example, binary data.

The column decoder 5 illustrated in FIG. 1 decodes a column address from the address register 10. Based on the result of the decoding, the column decoder 5 also determines whether to transfer the data retained in the data latch circuit 7 to a data bus.

The I/O buffer 12 buffers an address, data, and a command input from an I/O terminal. In addition, the I/O buffer 12 transfers the address to the address register 10, transfers the command to a command register, and transfers the data to the data bus.

The controller 8 identifies the address and the command and also controls the operation of the aforementioned sense amplifier 6 and the like.

Figure 3:
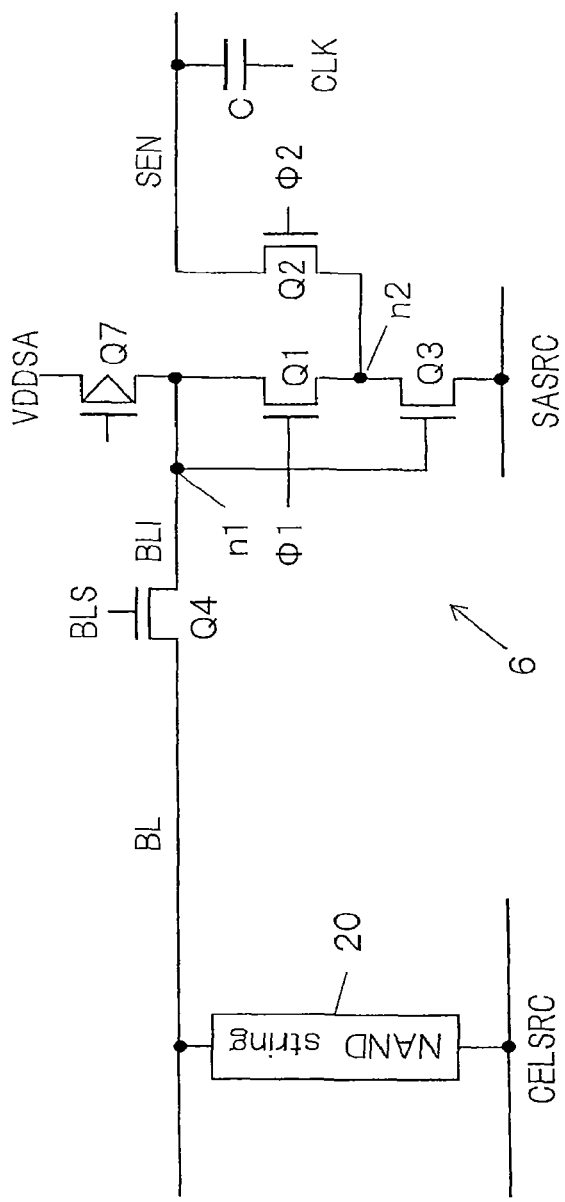
FIG. 3 is a simplified circuit diagram for explaining an operation principle of a sense amplifier 6 according to a first embodiment.

FIG. 3 is a simplified circuit diagram for explaining an operation principle of a sense amplifier 6 according to a first embodiment. The sense amplifier 6 in FIG. 3 includes a first transistor Q1, a second transistor Q2, and a third transistor Q3. The first and second transistors Q1 and Q2 are cascode-connected on an electric current path between the bit line BL and an SEN node (sense node). The third transistor Q3 is connected between a second node n2 and an SASRC node (a second voltage setting node or a third node) located between these first and second transistors Q1 and Q2.

A NAND string 20 having a configuration similar to that illustrated in FIG. 2 is connected between the bit line BL and a CELSRC node (a first voltage setting node). A gate of the third transistor Q3 in addition to a drain of the first transistor Q1 is connected to a first node n1. A fourth transistor Q4 is connected on an electric current path between this first node n1 and the bit line BL. This fourth transistor Q4 is a high-breakdown voltage transistor provided to electrically isolate the bit line BL from the first node n1 when, for example, the memory cell 21 is erased. Additionally, a PMOS transistor Q7 is disposed between a VDDSA node and the first node n1.

The SEN node acts as a drain of the second transistor Q2 and one end of a capacitor C is connected to this SEN node. This SEN node is a sense node that charges and discharges the capacitor C depending on logic of the data read from the memory cell 21.

The controller 8 in FIG. 1 controls the first to fourth transistors Q1 to Q4 and the transistor Q7 to switch on and off. All of the first to fourth transistors Q1 to Q4 are NMOS transistors.

Figure 4:
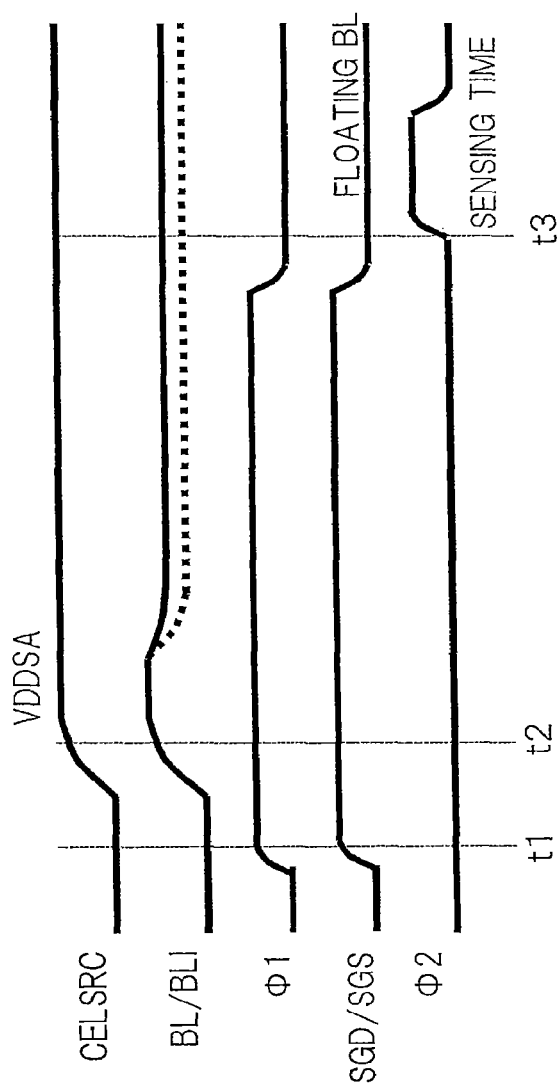
FIG. 4 is a timing diagram of FIG. 3.

FIG. 4 is a timing diagram of FIG. 3. In order to read from the memory cell 21, first, a gate voltage $\phi 1$ for the first transistor Q1 is turned high and a gate voltage $\phi 2$ for the second transistor Q2 is turned low (time t1). At this time, it is desirable to restrain voltage fluctuations in the second node n2 to thereby suppress drain bias dependence of the first transistor Q1. For this purpose, it is simple to set the gate voltage $\phi 1$ for the first transistor Q1 to a voltage obtained by adding a voltage at the SASRC node, a threshold voltage of the first transistor Q1, and an overdrive voltage (approximately 0.2 V or the like). Both of the select gate lines SGS and SGD are turned to a high level at this time t1.

Thereafter, the CELSRC node on one end side of the NAND string 20 is raised to a VDDSA (time t2). With this, voltages at bit lines BL/BLI hardly fall when data to be read from the memory cell 21 within the NAND string 20 represents "1" (a solid line portion in FIG. 4), while considerably falling when the data represents "0" (a dashed line portion in FIG. 4).

At the time t2, the gate voltage $\phi 1$ for the first transistor Q1 is still set to the voltage obtained by adding the voltage at the SASRC node, the threshold voltage of the first transistor Q1, and the overdrive voltage. Accordingly, although the first transistor Q1 is in an ON state, the second node n2 is clamped at a voltage obtained by adding the voltage at the SASRC node and the overdrive voltage, and thus becomes a voltage equal to a drain voltage of the first transistor Q1 (a voltage at the first node n1) or slightly less. In addition, the first node n1 becomes a voltage in accordance with a cell electric current flowing in the bit line BL. The second node n2 has a voltage higher than that at the SASRC node and furthermore a voltage at the first node n1 is applied to the gate of the third transistor Q3. As a result, the third transistor Q3 operates as a diode. Consequently, an electric current flowing from the CELSRC node through the NAND string 20 and the bit line BL passes through the fourth transistor Q4, the first transistor Q1, and the third transistor Q3 in this order to flow into the SASRC node (the second voltage setting node).

After a certain period of time has elapsed since the time t2, an electric potential of the bit line BL and an electric potential of the second node n2 between the first and third transistors Q1 and Q3 are made stable. In this condition, the first transistor Q1 and the fourth transistor Q4 are turned off and at the same time the gate voltage $\phi 2$ similar to the gate voltage $\phi 1$ at the time t1 is applied to a gate of the second transistor Q2 (time t3). More specifically, the gate voltage $\phi 2$ is obtained by adding the voltage at the SASRC node, a threshold voltage of the second transistor Q2, and the overdrive voltage. As a result, the second node n2 is kept at a voltage level similar to that at the time t1. Because both of the first transistor Q1 and the fourth transistor Q4 are turned off, the first node n1 is turned into a high-impedance state and thus maintained at an electric potential before the time t3.

By equalizing the gate voltage $\phi 2$ for the second transistor Q2 at the time t3 to the gate voltage $\phi 1$ for the first transistor Q1 at the time t1, the voltage level of the second node n2 is kept as well and the third transistor Q3 continues to operate as the diode after the time t3, whereby an electric current from the SEN node flows to the SASRC node through the second transistor Q2 and the third transistor Q3. At the time of the time t3, the electric potential of the bit line BL varies depending on the data logic of a cell to be read out within the NAND string 20. Due to this electric potential, the electric current flowing to the SASRC node from the SEN node also varies after the time t3 and accordingly an electric potential of the SEN node is determined depending on the electric current that has flowed. This electric potential of the SEN node is sensed to determine that data represents "0" or "1".

As described above, the gate voltages φ1 and φ2 for the first and second transistors Q1 and Q2, respectively, are controlled such that the electric potentials of both of the first node n1 and the second node n2 are not changed between before and after the first transistor Q1 and the second transistor Q2 are switched on or off at the time t3. As a result, even when the first and second transistors Q1 and Q2 are switched on or off, an electric current flowing between a drain and a source of the third transistor Q3 is kept substantially unchanged.

In the description above, the fourth transistor Q4 is turned off at the timing when the first transistor Q1 is turned off and the second transistor Q2 is turned on such that the first node n1 is set to the high-impedance state. However, instead of turning off the fourth transistor Q4, at least one of the select gate transistors S1 and S2 within the NAND string may be turned off.

As described thus far, according to the first embodiment, the first transistor Q1 is turned on during reading from the memory cell 21 such that an electric current from the bit line BL flows to the diode-connected third transistor Q3, thereby making the electric potentials of the bit line BL and the second node n2 stable. Thereafter, the second transistor Q2 is turned on such that an electric current from the SEN node flows to the diode-connected third transistor Q3, whereby the SEN node is discharged. In other words, in the embodiment, even while any one of the first and second transistors Q1 and Q2 is being turned on, the third transistor Q3 operates as the diode, thereby preventing a discharge electric current from the SEN node from flowing toward the cell. Consequently, reading from the memory cell 21 can be carried out not depending on the voltage at the CELSRC node on the one end side of the NAND string 20, whereby a voltage at the SEN node can be lowered during reading without a reduction in the voltage at the CELSRC node, which reduction causes a decrease in the reliability of the memory cell 21. As a result, low-voltage driving can be realized without the deterioration of the reliability of the memory cell 21.

Additionally, an electric potential of the SASRC node can be adjusted without affecting an electric potential of the CELSRC node. As will be described later, by adjusting the electric potential of the SASRC node, a temperature property of the memory cell 21, fluctuations in resistance of a cell electric current path, variations in a threshold of the diode-connected third transistor Q3, and the like can be adjusted.

Second Embodiment

In a second embodiment described hereinafter, the sense amplifier 6 according to the first embodiment is more specifically exemplified.

FIG. 5 is a circuit diagram of a sense amplifier 6 according to a second embodiment. In FIG. 5, transistors functionally similar to those in FIG. 3 are denoted by similar reference numerals. The sense amplifier 6 in FIG. 5 includes fifth to fifteenth transistors Q5 to Q15 and a latch unit (latch circuitry) 31 in addition to the first to fourth transistors Q1 to Q4 illustrated in FIG. 3.

The fifth transistor Q5 is connected between a gate and a source of a third transistor Q3. The fifth transistor Q5 is provided to flow an electric current flowing from a bit line BL to a third node n3 without passing through a first and second transistors Q1 and Q2 during data writing to a memory cell 21. The fifth transistor Q5 is switched on and off by a GRS signal.

The sixth transistor Q6 is disposed between the source of the third transistor Q3 and an SASRC node and switched on and off by an INV signal.

The seventh transistor Q7 and the eighth transistor Q8 are cascode-connected between a power supply voltage node VDD and a second node n2. The seventh transistor Q7 is switched on and off by the INV signal, whereas the eighth transistor Q8 is switched on and off by a BLX signal.

The ninth transistor Q9 is disposed between an LBUS node and an SEN node and switched on and off by a BLQ signal. The tenth transistor Q10 and the eleventh transistor Q11 are cascode-connected between the LBUS node and a CLK node. The tenth transistor Q10 is switched on and off by an STB signal.

The twelfth transistor Q12 is disposed between the LBUS node and an input node of the latch unit 31 and switched on and off by an STI signal. The thirteenth transistor Q13 is disposed between the LBUS node and an output node of the latch unit 31 and switched on and off by an STL signal.

The fourteenth transistor Q14 and the fifteenth transistor Q15 are cascode-connected between a power supply voltage node VDD and a ground node. As will be described later, the fourteenth transistor Q14 and the fifteenth transistor Q15 operate as a lock-out control unit (lock-out control circuitry) that forcefully inverts logic of latch data in the latch unit 31 during locking out. The fourteenth transistor Q14 is switched on and off by an LPCn signal, whereas the fifteenth transistor Q15 is switched on and off by an LDC signal.

The seventh transistor Q7 and the fourteenth transistor Q14 are the PMOS transistors, while the other transistors are the NMOS transistors.

The INV signals input to gates of the sixth and seventh transistors Q6 and Q7 are signals with logic similar to that of latch data INV in the latch unit 31.

FIG. 5 depicts an example where a BLC signal is supplied to a gate of the first transistor Q1, an XXL signal is supplied to a gate of the second transistor Q2, a BLI signal is supplied to the gate of the third transistor Q3, a BLS signal is supplied to a gate of a fourth transistor Q4, and the GRS signal is supplied to a gate of the fifth transistor Q5. The BLC signal corresponds to a φ1 signal in FIG. 1, whereas the XXL signal corresponds to a φ2 signal therein.

Figure 6:
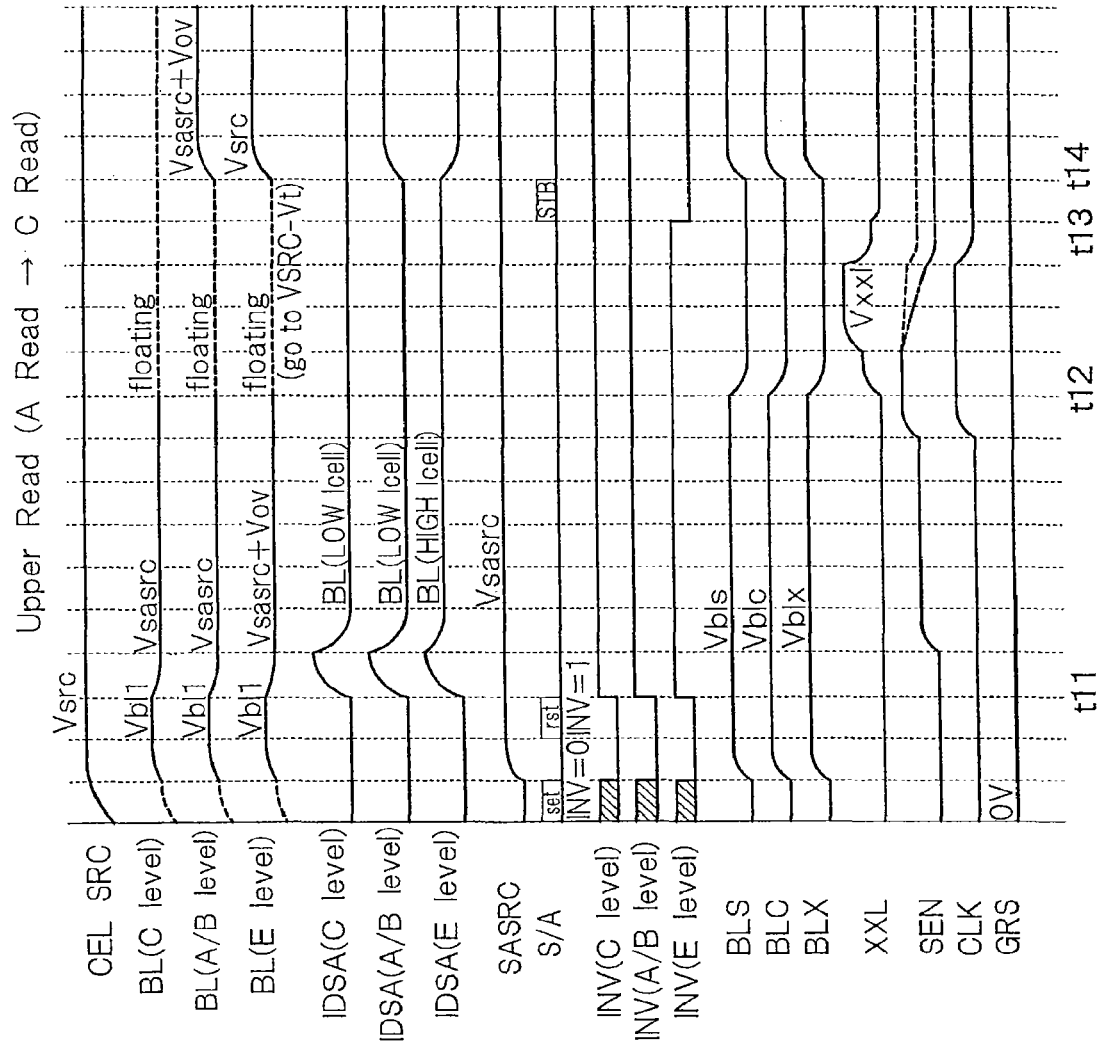
FIG. 6 is an operation timing diagram in a case where lock-out operation is carried out.
Figure 7:
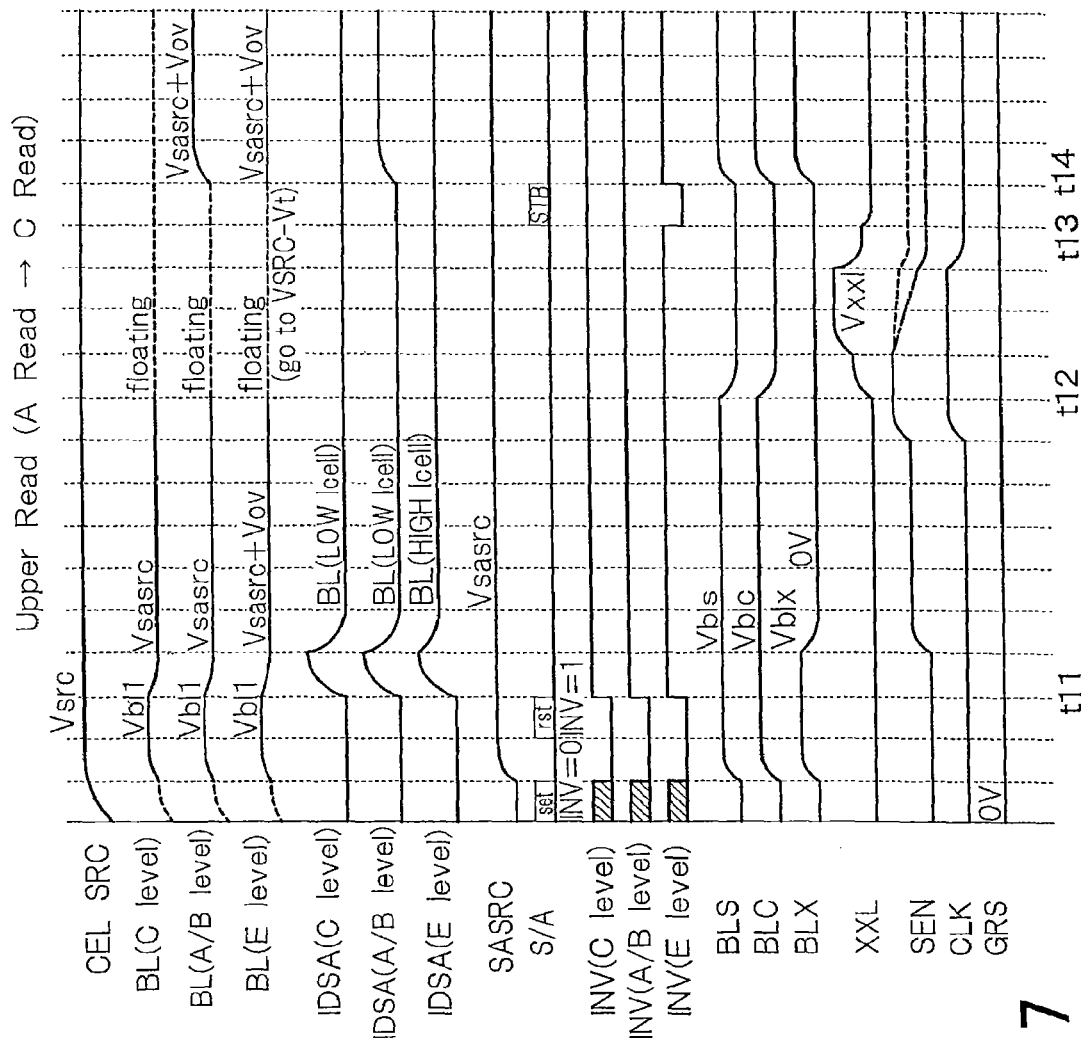
FIG. 7 is an operation timing diagram in a case where the lock-out operation is not carried out.

FIGS. 6 and 7 are timing diagrams illustrating operation timings of the sense amplifier 6 in FIG. 5. FIG. 6 depicts an operation timing in a case where lock-out operation is carried out such that a read electric current does not flow after valid data has been read from the memory cell 21, whereas FIG. 7 depicts an operation timing in a case where the lock-out operation is not carried out. That is, the sense amplifier 6 in FIG. 5 can arbitrarily change a setting of whether to carry out the lock-out operation.

The timing diagrams in FIGS. 6 and 7 depict operation timings in the case of reading from the memory cell 21 to which multiple-value data is written. For example, reading from the memory cell 21 to which four-value data is written is carried out in separate processing levels of upper read and lower read. FIGS. 6 and 7 depict operation timings for the upper read.

In the timing diagrams in FIGS. 6 and 7, IDSA (C level), IDSA (A/B level), and IDSA (E level) represent waveforms of electric currents flowing between the drain and the source of the diode-connected third transistor Q3 during reading from a C level, an A/B level, and an E level of the memory cell 21, respectively. The other signal waveforms in FIGS. 6 and 7 represent voltage waveforms.

The INV signals are shifted to a high level from a low level at a time t11 in FIG. 6. At this time, each of the CELSRC node, the BLS signal, the BLC signal, and the BLX signal has a high voltage. With this, an electric current flows into the SASRC node from the CELSRC node through the NAND string 20, the fourth transistor Q4, the first transistor Q1, the third transistor Q3, and the sixth transistor Q6 in this order and after a certain period of time, electric potentials of the bit line BL and the second node n2 are made stable. As described earlier, the electric potentials of both of the bit line BL and the second node n2 are set to electric potentials in accordance with data logic of a cell to be read out within the NAND string 20.

When the BLS signal, the BLC signal, and the BLX signal are turned low and the XXL signal is turned high at a time t12, an electric current flows into the SASRC node from the SEN node through the second transistor Q2, the third transistor Q3, and the sixth transistor Q6.

With this, the SEN node is set to an electric potential in accordance with the electric potential of the second node n2 immediately before the time t12 as indicated by a dashed line or a one-dot chain line in FIG. 6. The latch unit 31 latches data with logic in accordance with the electric potential of the SEN node during a period from a time t13 to a time t14.

Figure 8A:
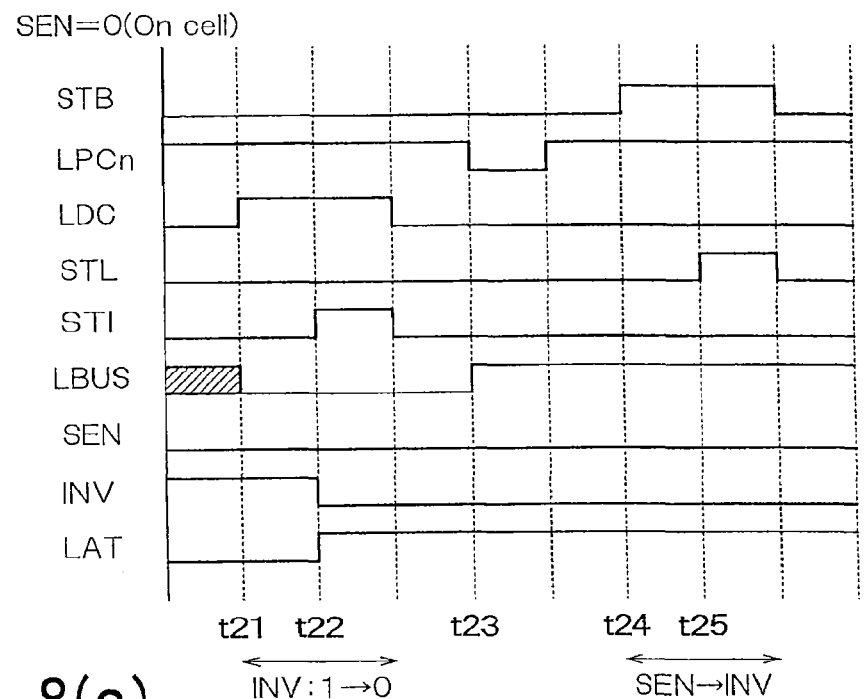
FIGS. 8(a) and 8(b) are detailed timing diagrams of a period from a time t13 to a time t14 in FIG. 6.
Figure 8B:
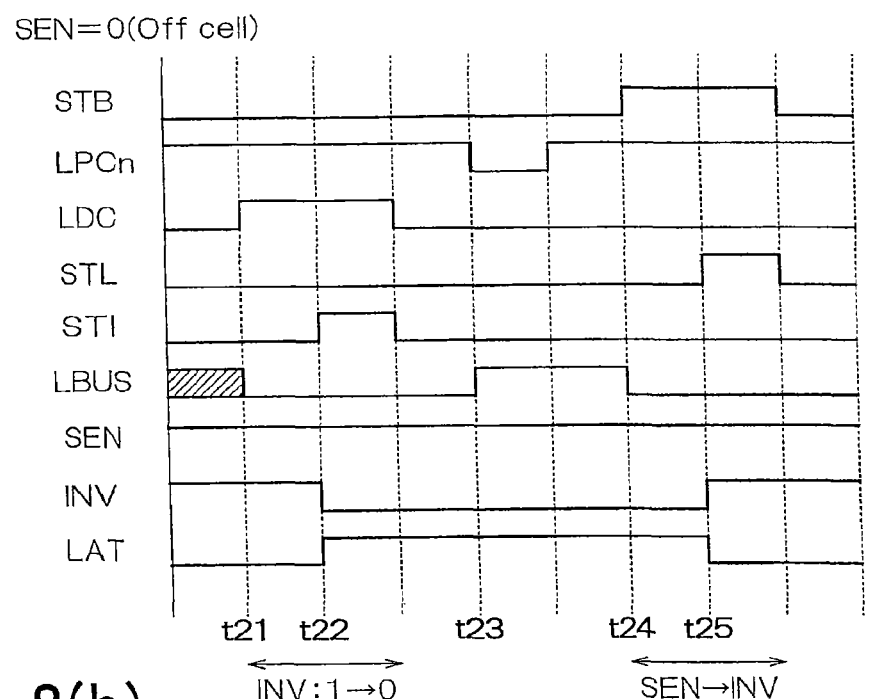

FIGS. 8(a) and 8(b) are detailed timing diagrams of a period from the time t13 to the time t14 in FIG. 6. The timing diagram in FIG. 8(a) depicts an operation timing in a case where the SEN node has a low electric potential, specifically, a case where data read from the memory cell 21 represents "0", whereas the timing diagram in FIG. 8(b) depicts an operation timing in a case where the SEN node has a high electric potential.

When the LDC signal is turned high at a time t21 in FIG. 8(a), the fifteenth transistor Q15 is turned on while the LBUS node is turned low. Thereafter, when the STI signal is turned high at a time t22, the twelfth transistor Q12 is turned on and an input node INV of the latch unit 31 is set to a low electric potential similar to that of the SEN node. The input node INV of the latch unit 31 is electrically connected with the INV signal illustrated in FIG. 5.

Normally, when the SEN node has a low electric potential, the eleventh transistor Q11 is being turned off and the LBUS node is kept at a high electric potential. The embodiment sets the INV signal to a low level after valid data has been read to carry out the lock-out operation such that an electric current from the SEN node does not flow to the SASRC node. For this reason, the INV signal is turned low at the time t22.

The latch unit 31 includes an inverter and a clocked inverter parallelly connected to each other to invert and output latched data. Accordingly, logic of the LBUS node and logic of an output node of the latch unit 31 need to be matched with each other until a time t25 when the thirteenth transistor Q13 is turned on such that signals with different logic from each other do not collide. For a solution to this, the LPCn signal is turned low at a time t23 to change the LBUS node to a high level from a low level.

When the SEN node has a high electric potential, reading from the memory cell 21 is not effectively completed yet. Accordingly, as illustrated in FIG. 8(b), the INV signal is temporarily changed to a low level at the time t22 and then returned to a high level at the time t25.

Comparing the operation timings in FIGS. 6 and 7, there is a different between FIGS. 6 and 7 in operation timings during the period from the time t13 to the time t14 and thereafter. In the period from the time t13 to the time t14, the electric potential of the SEN node is written to the latch unit 31 after an electric potential in accordance with logic of data read from the memory cell 21 has been set to the SEN node. In a case where the lock-out operation is not carried out, the INV signal is set to a high level at the time t14 as illustrated in FIG. 7. Accordingly, the sixth transistor Q6 is turned on and an electric current from the bit line BL or the SEN node continues to flow to the SASRC node through the sixth transistor Q6.

The sense amplifier 6 in FIG. 5 is able to not only read from the memory cell 21 using a sensing manner as illustrated in FIGS. 6 to 8 (hereinafter, referred to as new sensing manner) but also read from the memory cell 21 using the existing ABL manner.

Figure 9:
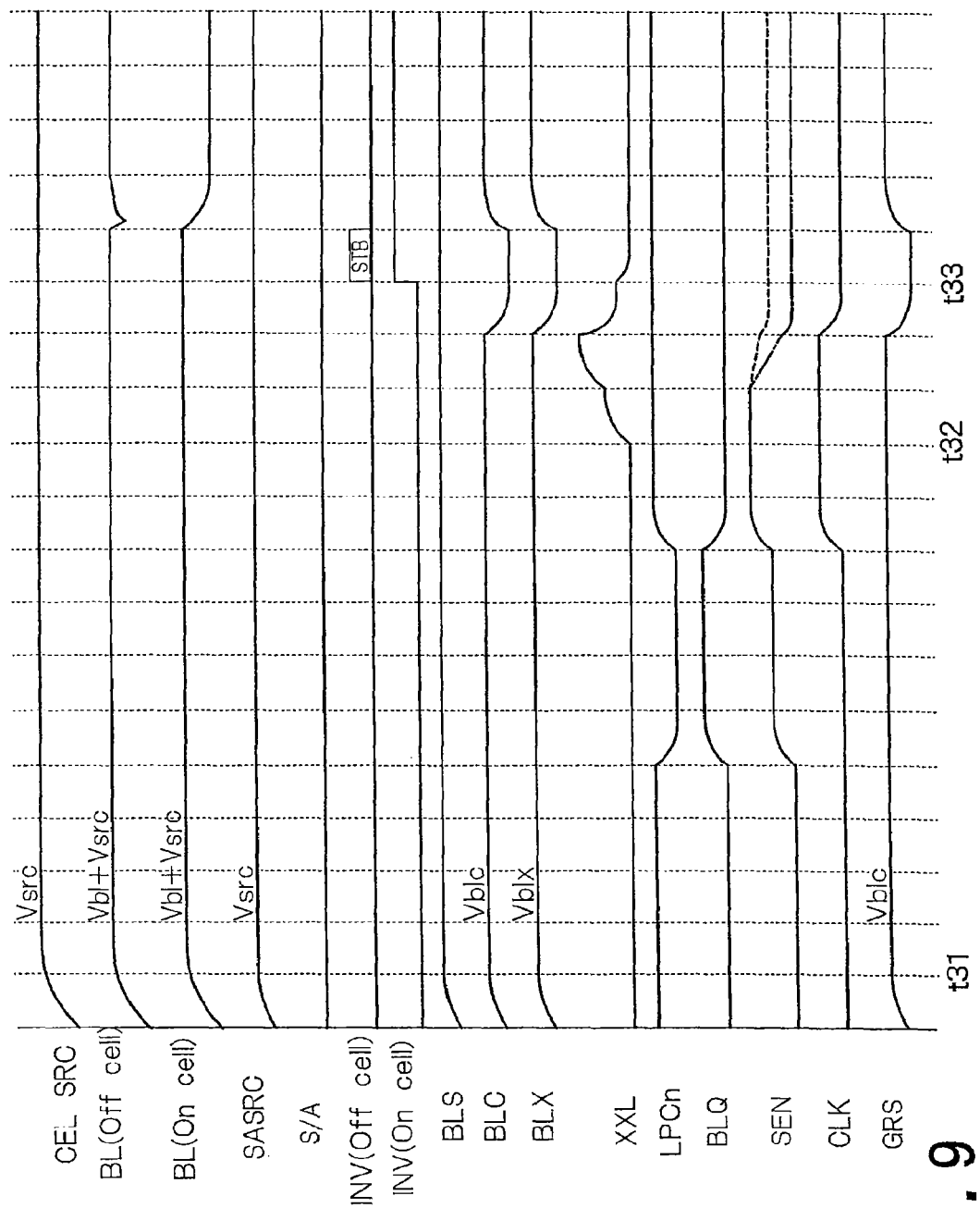
FIG. 9 is an operation timing diagram in the case of reading from a memory cell 21 using an ABL manner.

FIG. 9 is an operation timing diagram in the case of reading from the memory cell 21 using the ABL manner. In the ABL manner, all of the bit lines BL are precharged first (from a time t31 to a time t32). The INV signal is low during this period. Therefore, an electric current flows to the bit line BL through the seventh transistor Q7, the eighth transistor Q8, the first transistor Q1, and the fourth transistor Q4 in this order.

An electric potential level of the XXL signal is raised at the time t32 to turn on the second transistor Q2. With this, an electric current from the SEN node flows to the bit line BL through the second transistor Q2, the first transistor Q1, and the fourth transistor Q4. An amount of the electric current to flow varies depending on the electric potential of the bit line BL immediately before the time t32 and thus the electric potential of the SEN node is set to an electric potential level in accordance with data to be read from the memory cell 21.

Thereafter, the INV signal is turned high at a time t33 but the level of the XXL signal is discharged up to 0 V. Accordingly, the electric current does not flow to the SASRC node from the SEN node.

Figure 10:
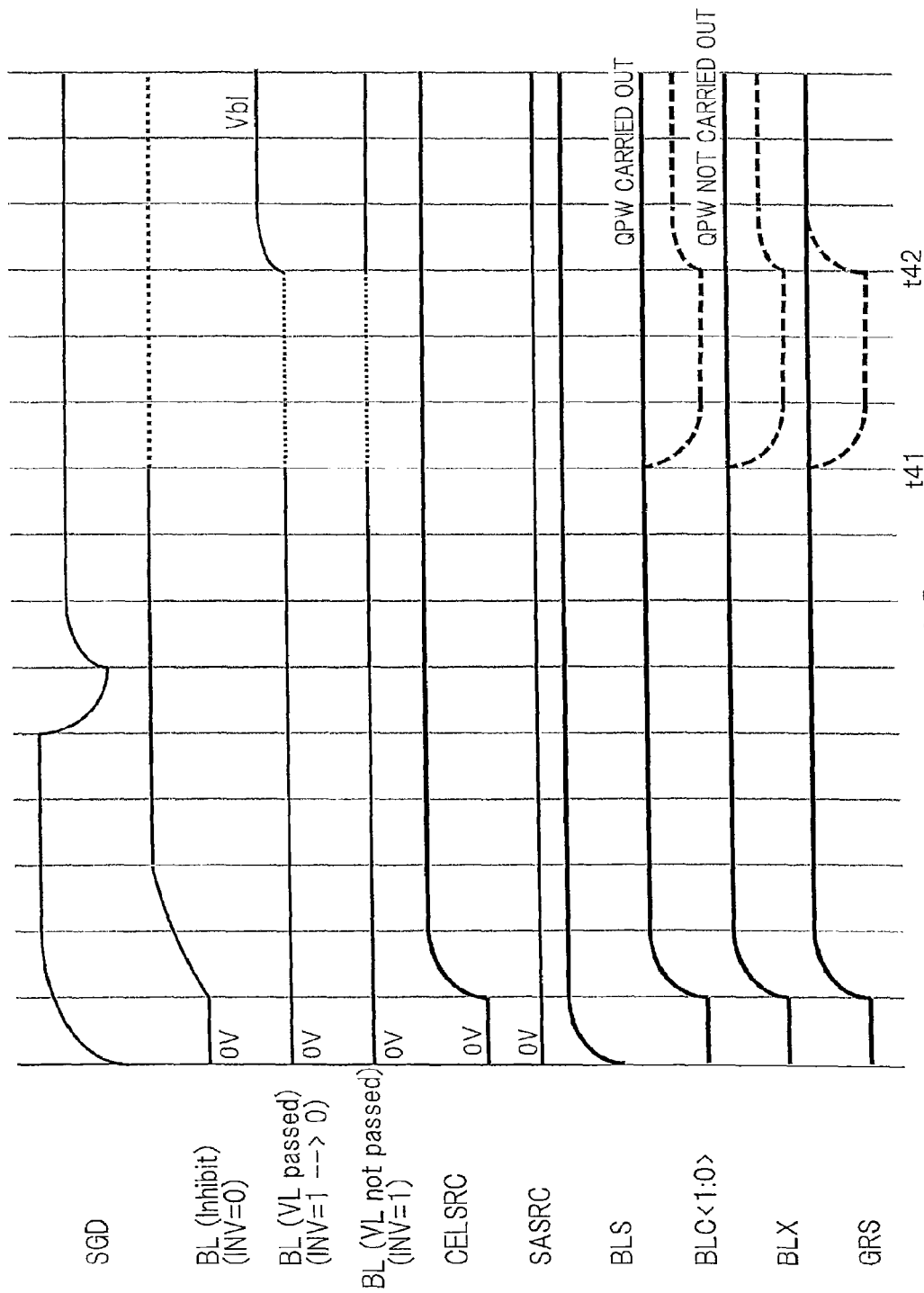
FIG. 10 is an operation timing diagram in the case of writing to the memory cell 21 using the sense amplifier 6 in FIG. 5.

FIG. 10 is an operation timing diagram in the case of writing (program) to the memory cell 21 using the sense amplifier 6 in FIG. 5. The sense amplifier 6 in FIG. 5 can also carry out quick pass write (QPW) as necessary. FIG. 10 depicts voltage waveforms of three bit lines BL, namely, a bit line BL for which the QPW is carried out (VL passed), a bit line BL for which the QPW is not carried out (VL not passed), and a bit line BL that is not to be written (inhibit). SGD depicts a gate voltage waveform of a select gate transistor within the NAND string 20.

The QPW gradually increases a write voltage applied to the memory cell 21 to be written. Accordingly, as indicated by dashed lines in FIG. 10, the BLC signal, the BLX signal, and the GRS signal are temporarily lowered to a great extent (time t41) and then slightly raised (time t42). In accordance with this, a voltage of the bit line BL (VL passed) is slightly raised as well.

The sense amplifier 6 in FIG. 5 is also able to employ a sensing manner for reading from the memory cell 21 by separately processing an even bit line BL and an odd bit line BL.

Figure 11:
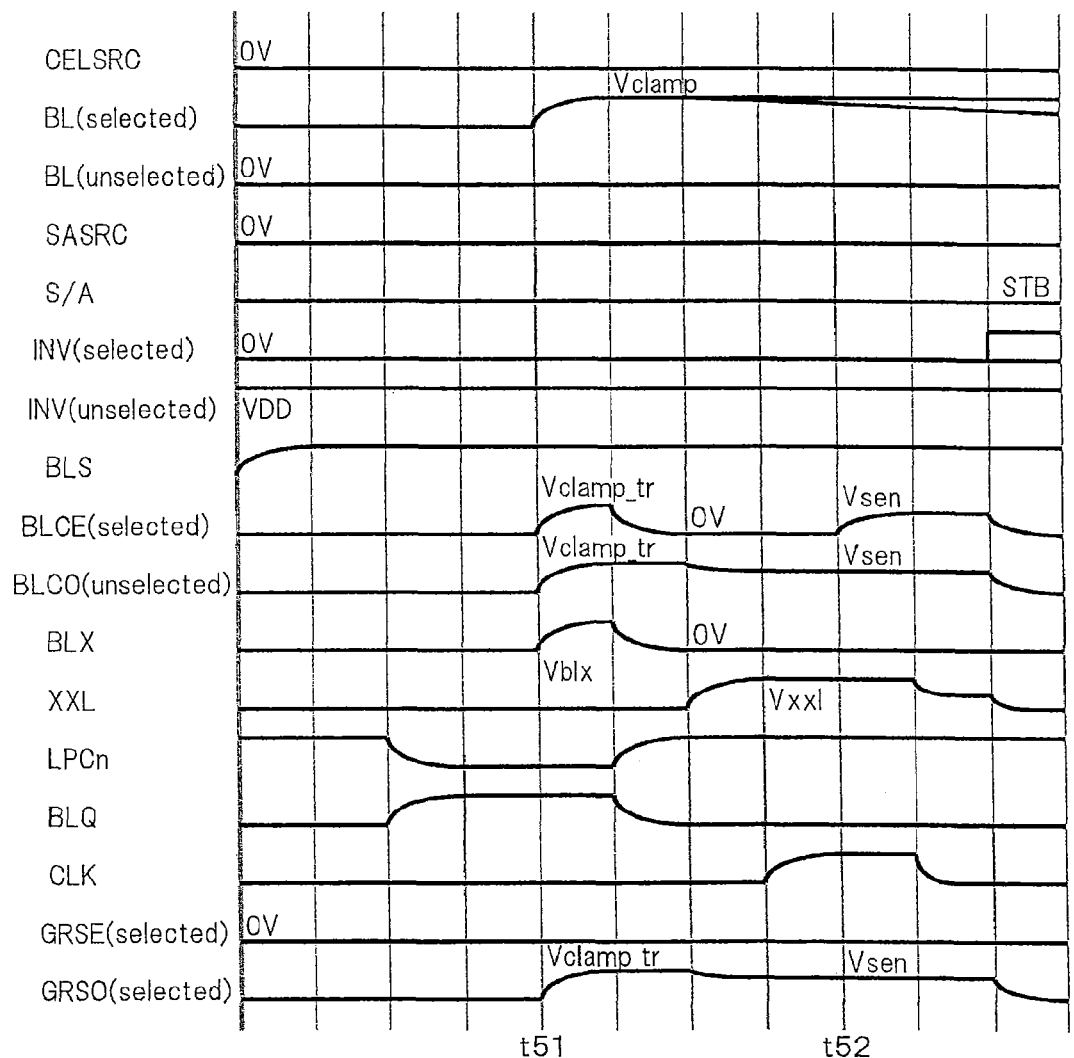
FIG. 11 is an operation timing diagram in the case of reading from the memory cell 21 using the sense amplifier 6 in FIG. 5 by separately processing an even bit line BL and an odd bit line BL.

FIG. 11 is an operation timing diagram in the case of reading from the memory cell 21 using the sense amplifier 6 in FIG. 5 by separately processing the even bit line BL and the odd bit line BL. In FIG. 11, gate signals for the first transistor Q1 corresponding to an even-numbered bit line and an odd-numbered bit line are denoted by BLCE and BLCO, respectively. Likewise, gate signals for the fifth transistor Q5 corresponding to an even-numbered bit line and an odd-numbered bit line are denoted by GRSE and GRSO, respectively. The timing diagram in FIG. 11 depicts an operation timing in a case where the even bit line BL is selected but the odd bit line BL is not selected. All of the bit lines BL are temporarily clamped at a predetermined voltage at a time t51 and then the even bit line BL to be used for reading is set to an electric potential in accordance with a cell to be read out within the NAND string 20, while the odd bit line BL is kept at the clamped voltage (time t52). As illustrated in FIG. 11, the odd bit line BL is clamped while the even bit line BL is used during reading, on the other hand, the even bit line BL is clamped while the odd bit line BL is used during reading. As a result, the electric potential of the bit line BL can be sensed without being affected by fluctuations in an electric potential of an adjacent bit line BL, thereby enhancing accuracy in data reading.

The controller 8 illustrated in FIG. 1 can arbitrarily set which one of the following processing is employed: the new sensing manner illustrated in FIGS. 6 to 8 (first sensing manner), the lock-out operation, the ABL sensing manner (second sensing manner) illustrated in FIG. 9, the QPW illustrated in FIG. 10, and the sensing manner illustrated in FIG. 11.

As described thus far, because the sense amplifier 6 according to the second embodiment includes the first to fourth transistors Q1 to Q4 similar to those in the first embodiment, an effect similar to that in the first embodiment can be obtained. The sense amplifier 6 according to the embodiment is also able to employ the new sensing manner for flowing an electric current to the SASRC node from the SEN node through the diode-connected third transistor Q3. Additionally, the existing ABL manner can be employed as well. Furthermore, whether to carry out the lock-out operation after valid data has been read from the memory cell 21 can be arbitrarily set. Whether to carry out the QPW can be also set arbitrarily. In addition, the sensing manner for reading data by separately processing the even bit line BL and the odd bit line BL can be employed.

Third Embodiment

The sense amplifier 6 in FIG. 5 includes the sixth transistor Q6 disposed between the second node n2 and the SASRC node to carry out the lock-out operation. However, a circuit configuration different from that in FIG. 5 can be used in a case where the lock-out operation does not need to be carried out.

Figure 12:
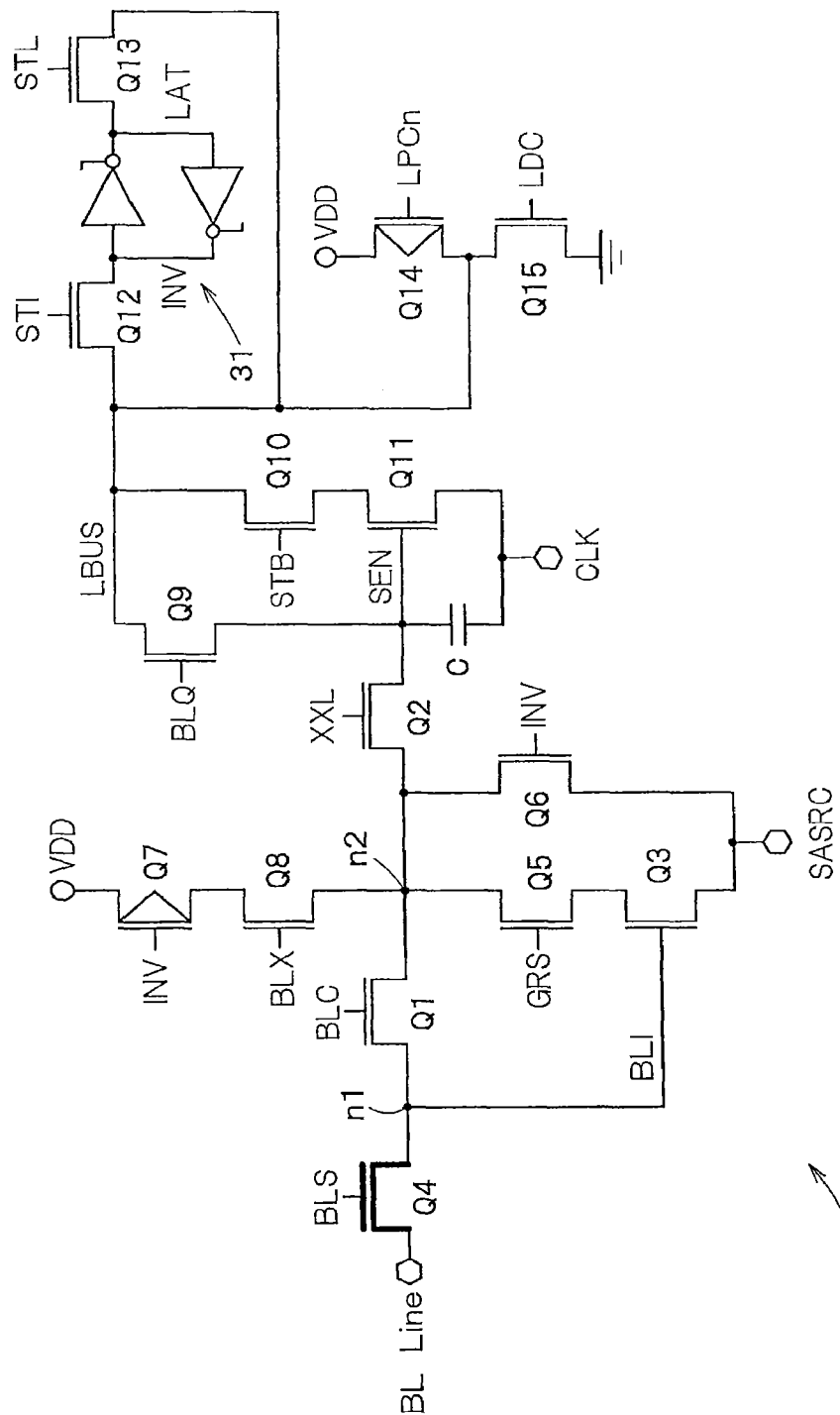
FIG. 12 is a circuit diagram of a sense amplifier 6 according to a third embodiment.

FIG. 12 is a circuit diagram of a sense amplifier 6 according to a third embodiment. In FIG. 12, components common to those in FIG. 5 are denoted by the same reference numerals and thus the following description is focused on differences therebetween. The sense amplifier 6 in FIG. 12 differs from that in FIG. 5 in how a third transistor Q3, a fifth transistor Q5, and a sixth transistor Q6 are connected.

In FIG. 12, the fifth transistor Q5 and the third transistor Q3 are cascode-connected between a second node n2 and an SASRC node. In addition, the sixth transistor Q6 is disposed between the second node n2 and the SASRC node.

In FIG. 5, the GRS signal input to the gate of the fifth transistor Q5 becomes low during reading and turned high during writing. However, the GRS signal in FIG. 12 becomes high during reading and turned low during writing. Accordingly, the third transistor Q3 operates as the diode during reading while being isolated from a first node n1 during writing.

In the case of FIG. 12, the sixth transistor Q6 is turned off when the INV signal becomes low. However, an electric current from an SEN node flows to the SASRC node through the fifth transistor Q5 and the diode-connected third transistor Q3. Therefore, the lock-out operation cannot be carried out.

As described above, the sense amplifier 6 according to the third embodiment is not capable of executing the lock-out operation. Putting this aside, however, an effect similar to that in the second embodiment can be obtained.

Fourth Embodiment

As described above, the sense amplifiers 6 illustrated in FIGS. 5 and 12 can carry out the new sensing manner for flowing an electric current to the SASRC node from the SEN node during reading and the existing ABL manner for flowing an electric current toward the bit line BL from the SEN node by arbitrarily switching therebetween. This switching may be controlled by the controller 8 within a semiconductor storage device 1 in FIG. 1 or an external controller 41 provided separately from the semiconductor storage device 1.

Figure 13:
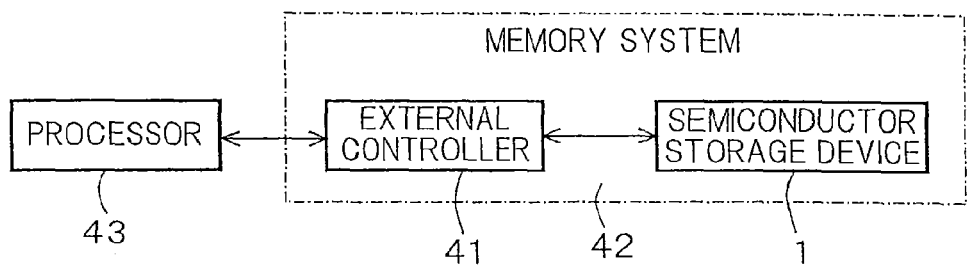
FIG. 13 is a schematic block diagram of a memory system 42 including an external controller 41 and the semiconductor storage device 1.

FIG. 13 is a schematic block diagram of a memory system 42 including the external controller 41 and the semiconductor storage device 1. Upon receiving an instruction from a processor 43, the external controller 41 accesses the semiconductor storage device 1 to write and read data. As described above, the external controller 41 can switch the sensing manner of the sense amplifier 6.

As a manner for giving an instruction of the switching of the sensing manner, for example, any one of an instruction with a prefix command, an instruction with a Set Feature command sequence, and an instruction with a parameter set is considered. Alternatively, another instruction manner may be employed.

Figure 14:
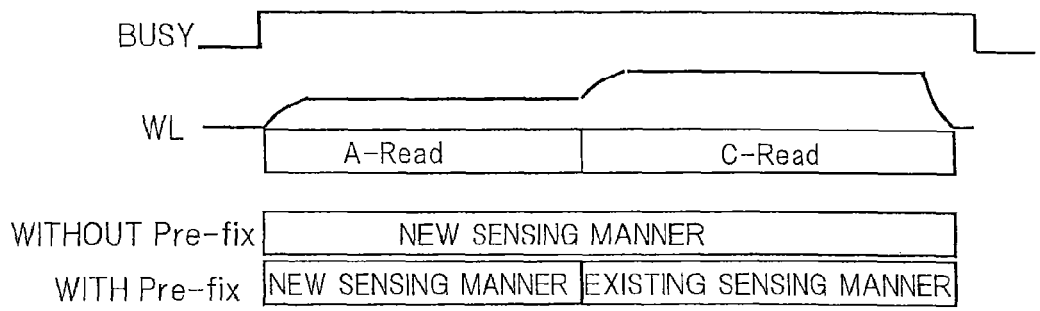
FIG. 14 is a schematic timing diagram in the case of instructing with a prefix command.

FIG. 14 is a schematic timing diagram in the case of instructing with the prefix command. FIG. 14 depicts an example where the sensing manner is changed between reading from a level A and reading from a level C when data is read from a memory cell 21 to which multiple-value data is written.

In a case where the instruction is given with the prefix command, for example, the new sensing manner is employed for the level A, whereas the ABL sensing manner is employed for the level C. In a case where the instruction is not given with the prefix command, the new sensing manner is employed for both of the level A and level C.

Figure 15:
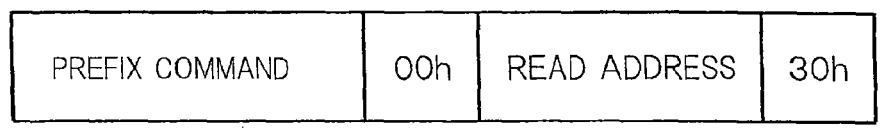
FIG. 15 is a diagram illustrating an exemplary procedure for transmitting an external prefix command.

As illustrated in FIG. 15, the external controller 41 transmits an external prefix command, a read command 00h, a read address, and a read command 30h to the semiconductor storage device 1 in this order through an I/O bus or the like. The controller 8 within the semiconductor storage device 1 parses the external prefix command to select one of the new sensing manner and the ABL sensing manner.

As described thus far, the fourth embodiment makes it possible to change a setting of the sensing manner of the sense amplifier 6 from the outside of the semiconductor storage device 1. As a result, the operation of the sense amplifier 6 can be easily confirmed.

Fifth Embodiment

The sense amplifier 6 in FIG. 1, 5, or the like includes the SASRC node provided on a source side of the diode-connected third transistor Q3. By adjusting a voltage at this SASRC node, a voltage at the bit line BL can be changed. A purpose of changing the voltage at the bit line BL is, for example, 1) to adjust the cell electric current, 2) to offset the fluctuations in the resistance of the cell electric current path, and 3) to cancel the variations in the threshold of the diode-connected third transistor Q3.

Figure 16:
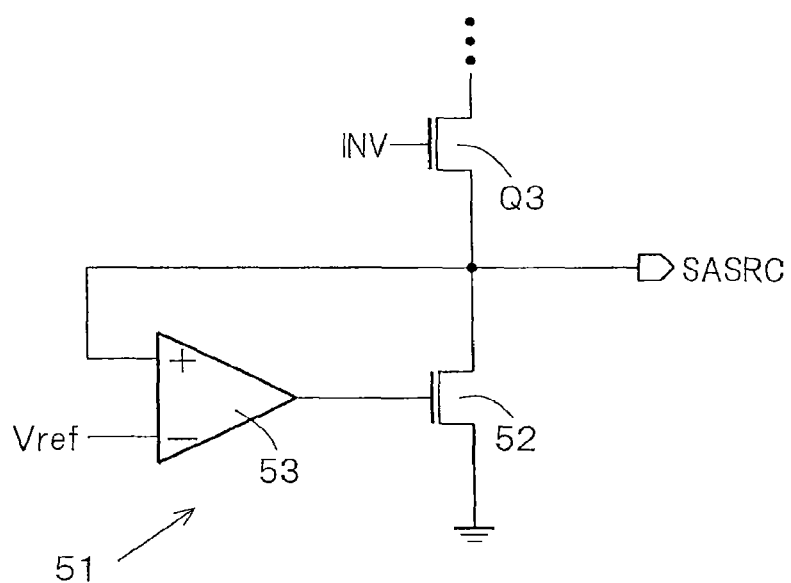
FIG. 16 is a circuit diagram illustrating an example of a voltage adjustment unit 51 that adjusts a voltage at an SASRC node.

FIG. 16 is a circuit diagram illustrating an example of a voltage adjustment unit (voltage adjustment circuitry) 51 that adjusts a voltage at an SASRC node. The voltage adjustment unit 51 in FIG. 16 includes a transistor 52 disposed between the SASRC node and a ground node, and a comparator 53 that adjusts a gate voltage for this transistor 52. By comparing the voltage at the SASRC node with a reference voltage Vref, the comparator 53 lowers the gate voltage for the transistor 52 when the voltage at the SASRC node is high, and on the other hand, raises the gate voltage for the transistor 52 when the voltage at the SASRC node is low.

1) Typically, a threshold of a memory cell 21 becomes lower as an ambient temperature rises. When the threshold of the memory cell 21 is low, it is possible to easily pass an electric current through a bit line BL from a CELSRC node through a NAND string 20, which raises a voltage at the bit line BL. In this case, when the voltage at the SASRC node is raised, the electric current does not easily flow between a drain and a source of a diode-connected third transistor Q3. As a result, an amount of the electric current flowing in the bit line BL can be suppressed. Consequently, in a case where the ambient temperature rises, the SASRC node is simply set to a high level using, for example, the circuit in FIG. 16.

2) As a distance from the NAND string 20 to a sense amplifier 6 becomes longer, the influence of the resistance of the bit line BL becomes larger. Accordingly, the resistance of the cell electric current path passing through the bit line BL becomes higher, while a voltage at the bit line BL becomes lower. For a solution to this, in a case where data is read from the memory cell 21 within a cell block located at a position away from the sense amplifier 6, the voltage at the SASRC node is lowered to increase an electric current flowing in the bit line BL using, for example, the circuit in FIG. 16.

3) The diode-connected third transistor Q3 has the variations in the threshold. When the threshold is low, it is possible to easily pass an electric current through the third transistor Q3 from the bit line BL. Accordingly, the SASRC node is simply set to a high level in this case using, for example, the circuit in FIG. 16. On the other hand, when the threshold is high, the electric current does not easily flow to the third transistor Q3 from the bit line BL. Accordingly, the SASRC node is simply set to a low level.

FIG. 16 depicts an example where a circuit for the voltage adjustment is connected to the SASRC node. However, this circuit may be connected to the third node n3 between the third transistor Q3 and the sixth transistor Q6 in FIG. 5 or the like.

As described thus far, according to the fifth embodiment, the circuit that adjusts the voltage at the SASRC node is provided to offset the changes in the cell electric current due to a temperature, the fluctuations in the resistance of the cell electric current path, and the variations in the threshold of the diode-connected third transistor Q3. As a result, it is possible to pass a stable electric current through the bit line BL, whereby the reliability of data reading is enhanced.

Sixth Embodiment

As described in the aforementioned fifth embodiment, the voltage at the SASRC node can fluctuate depending on 1) the ambient temperature, 2) the distance from the NAND string 20 to the sense amplifier 6, and 3) the variations in the threshold of the diode-connected third transistor Q3. Accordingly, the reference voltage Vref to be compared with the voltage at the SASRC node also needs to be adjusted by the comparator 53 in FIG. 16 by taking the aforementioned 1) to 3) into consideration. In other words, it is desirable that, in a case where the voltage at the SASRC node fluctuates due to the aforementioned 1) to 3), the reference voltage Vref be also caused to fluctuate by an amount of that fluctuation. For a solution to this, a sixth embodiment described hereafter is characterized by adding a reference voltage generation circuit to the voltage adjustment unit 51 in FIG. 16 to generate the reference voltage Vref. This reference voltage generation circuit adjusts the reference voltage Vref by taking the aforementioned 1) to 3) into consideration.

This reference voltage generation circuit does not need to be provided for each of sense amplifiers 6 and thus the plurality of sense amplifiers 6 can share one reference voltage generation circuit. For example, the reference voltage generation circuit may be provided for each of memory banks. In this case, in order to compare the voltages at all of the SASRC nodes within one memory bank, the reference voltage Vref generated by a corresponding reference voltage generation circuit is used.

Figure 17:
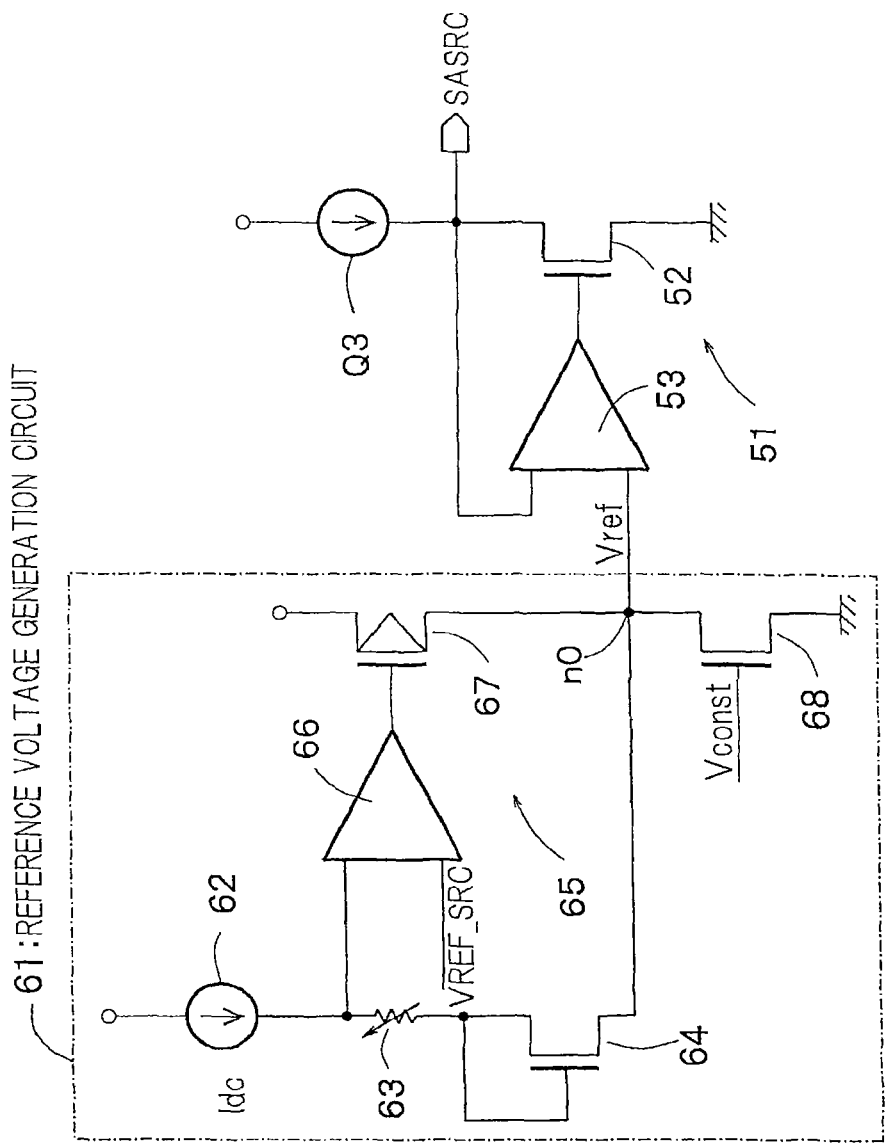
FIG. 17 is a circuit diagram illustrating an example of a reference voltage generation circuit 61.

FIG. 17 is a circuit diagram illustrating an example of the reference voltage generation circuit 61. The reference voltage generation circuit 61 in FIG. 17 includes an electric current source 62, a resistance replica unit (resistance replica circuitry) 63, a diode replica unit (diode replica circuitry) 64, and a feedback control unit (feedback control circuitry) 65. In FIG. 17, the diode-connected third transistor Q3 in FIG. 3 or the like is depicted as the electric current source 62.

The electric current source 62 generates an electric current in accordance with an electric current flowing in a NAND string 20 to be read out. The electric current source 62 does not necessarily need to be provided within the reference voltage generation circuit 61 and may be provided at a certain place within a semiconductor storage device 1. The electric current generated by the electric current source 62 is set in advance. More specifically, the electric current generated by the electric current source 62 is ideally set to an electric current serving as a boundary at which the sense amplifier 6 determines that a certain memory cell within the NAND string 20 is a cell in an ON state. As described above, the threshold of the memory cell 21 typically becomes lower as an ambient temperature rises and thus a cell electric current flowing in the NAND string 20 increases. Accordingly, the electric current output from the electric current source 62 may be variably controlled depending on the ambient temperature. Alternatively, the ambient temperature may be assumed in advance when the reference voltage generation circuit 61 in FIG. 17 is designed such that a value of the electric current output from the electric current source 62 is set as a fixed value based on the assumed temperature.

The resistance replica unit 63 is connected on an electric current path of the electric current source 62 and has a resistance value in accordance with a resistance value of the bit line. Specifically, the resistance replica unit 63 has a resistance value balanced with a resistance value of the bit line when a read electric current is passed through the bit line from the NAND string 20 to be read out. Because the resistance value of the bit line varies depending on the distance from the NAND string 20 to the sense amplifier 6, it is desirable for the resistance value of the resistance replica unit 63 to be variably adjusted depending on which NAND string 20 to be read out. A resistance unit (resistance circuitry) of the resistance replica unit 63 is adjusted by, for example, the controller 8 illustrated in FIG. 1. However, accurate adjustment of the resistance value of the resistance replica unit 63 depending on the distance from each of the NAND strings 20 to the sense amplifier within the semiconductor storage device imposes a large processing burden on the controller 8. Accordingly, several resistance values of the resistance replica unit 63 may be prepared in advance such that one of the values is selected.

The diode replica unit 64 is connected between one end of the resistance replica unit 63 and an output node n0 of the reference voltage Vref and serves as a transistor simulating an electrical property of the third transistor Q3. The third transistor Q3 is provided for each of the SEN nodes and thus a large number of the third transistors Q3 are provided within the semiconductor storage device 1. The individual third transistors Q3 have electrical properties slightly different from each other. Accordingly, the diode replica unit 64 may be configured by parallelly connecting a plurality of transistors formed with a design criterion similar to that of the third transistor Q3. When the plurality of transistors is parallelly connected, the variations in the electrical properties can be averaged among the multiple transistors, whereby a difference in the electrical properties between the plurality of transistors and the third transistor Q3 can be reduced. In a case where the diode replica unit 64 is configured by the plurality of transistors, an electric current flowing from the electric current source 62 also needs to be adjusted in accordance with the number of the plurality of transistors.

The third transistor Q3 has the variations in the threshold and the variations due to the temperature property. As described above, however, when the plurality of transistors formed with the design criterion similar to that of the third transistor Q3 are parallelly connected to configure the diode replica unit 64, the variations in the threshold and the variations due to the temperature property can be offset.

The feedback control unit 65 includes a comparator 66, a PMOS transistor 67, and an NMOS transistor 68. The comparator 66 compares a voltage at a connection node between the electric current source 62 and the resistance replica unit 63 with a predetermined threshold voltage VREF_SRC to output a binary signal representing a relation between levels of these two voltages. This binary signal is input to a gate of the PMOS transistor 67. The PMOS transistor 67 and the NMOS transistor 68 are cascade-connected between a power supply node and a ground node, where the output node n0 of the reference voltage generation circuit 61 acts as drains of both of the transistors. The reference voltage Vref is output from this output node n0. The output node n0 of the reference voltage generation circuit 61 is also connected to a source of the diode replica unit 64, whereby feedback is controlled such that the voltage at the connection node between the electric current source 62 and the resistance replica unit 63 matches the predetermined threshold voltage VREF_SRC.

The reason why the comparator 66 controls feedback of the voltage at the connection node between the electric current source 62 and the resistance replica unit 63 is that this voltage at the connection node corresponds to a bit line voltage of the NAND string 20 to be read out. Accordingly, the reference voltage generation circuit 61 in FIG. 17 monitors the bit line voltage of the NAND string 20 to be read out in order to carry out processing equivalent to generation of the reference voltage Vref.

The bit line voltage of the NAND string 20 to be read out fluctuates depending on the temperature property of the NAND string 20. It is thus desirable to set the threshold voltage VREF_SRC by taking the temperature property of the NAND string 20 into consideration. The threshold voltage VREF_SRC does not need to be changed once the setting thereof is determined. However, the threshold voltage VREF_SRC may be variably controlled depending on a temperature detected by a temperature sensor or the like.

As described thus far, according to the sixth embodiment, the reference voltage generation circuit 61 has an electric current path similar to an electric current path from the NAND string 20 to the SASRC node through the bit line and the third transistor Q3 to generate the reference voltage Vref serving as a reference for adjusting the voltage at the SASRC node. As a result, the voltage at the SASRC node can be accurately adjusted. More specifically, the reference voltage Vref is generated by taking 1) the ambient temperature, 2) the distance from the NAND string 20 to the sense amplifier 6, and 3) the variations in the threshold of the diode-connected third transistor Q3 into consideration. Therefore, a difference in voltages between the voltage at the SASRC node with a possibility of fluctuations caused by the aforementioned 1) to 3) and the reference voltage Vref is no longer affected by 1) to 3). Consequently, the voltage at the SASRC node can be accurately adjusted in accordance with the reference voltage Vref without being affected by the aforementioned 1) to 3).

The aforementioned embodiments have described examples for applying the invention to the NAND-type flash memory. However, the invention can be applied to various types of non-volatile semiconductor storage devices such as a NOR-type flash memory, an MRAM, and ReRAM.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor storage device comprising:
a memory string including a memory cell;
a bit line electrically connected to one end of the memory string; and
a sense amplifier electrically connected to the bit line, wherein
the sense amplifier comprises:
a first transistor, one end of which is connected to a first node on an electric current path of the bit line, and another end of which is electrically connected to a second node;

a second transistor electrically connected between the second node and a sense node; and a third transistor, a gate of which is connected to the first node, and the third transistor being electrically connected between the second node and a third node whose voltage can be adjusted.

2. The semiconductor storage device according to claim 1, wherein an electric current flows to the third node from the bit line through the first transistor and the third transistor, and thereafter, an electric current flows to the third node from the sense node through the second transistor and the third transistor during reading from the memory cell.

3. The semiconductor storage device according to claim 1, wherein a gate voltage of the first transistor when an electric current flows to the third transistor from the bit line through the first transistor is a voltage obtained by adding a voltage at the third node, a threshold voltage of the first transistor, and a predetermined overdrive voltage, and a gate voltage of the second transistor when an electric current flows to the third transistor from the sense node through the second transistor is a voltage obtained by adding a voltage at the third node, a threshold voltage of the second transistor, and a predetermined overdrive voltage.

4. The semiconductor storage device according to claim 1, wherein the gate of the third transistor in addition to a drain of the first transistor is connected to the first node, and the third transistor operates as a diode when an electric current flows to the third transistor from the bit line through the first transistor and when an electric current flows to the third transistor from the sense node through the second transistor.

5. The semiconductor storage device according to claim 4, further comprising a fourth transistor connected to the first node on the electric current path of the bit line, wherein an electric current flows to the third node from the bit line through the first transistor and the third transistor, and thereafter, an electric current flows to the third node from the sense node through the third transistor and the second transistor during reading from the memory cell.

6. The semiconductor storage device according to claim 5, wherein the memory cell is a NAND-type flash memory cell, the semiconductor storage device further comprising a NAND string including the plurality of NAND-type flash memories serially connected between the bit line and a first voltage setting node, and a select gate transistor, and the fourth transistor is the select gate transistor.

7. The semiconductor storage device according to claim 5, wherein the memory cell is a NAND-type flash memory cell, the semiconductor storage device further comprising a NAND string including the plurality of NAND-type flash memories serially connected between the bit line and a first voltage setting node, and a select gate transistor, and the fourth transistor is disposed on an electric current path between the bit line and the first transistor.

8. The semiconductor storage device according to claim 1, further comprising a fifth transistor configured to pass an electric current flowing from the bit line to the third node during data writing to the memory cell without passing through the first and second transistors.

9. The semiconductor storage device according to claim 1, further comprising a sixth transistor disposed between the third node and a second voltage setting node.

10. The semiconductor storage device according to claim 9, wherein multiple-value data is written in the memory cell, and in a case where data read from the memory cell by setting a word line of the memory cell to a predetermined read voltage level has predetermined logic, the sixth transistor continues to be turned off until read operation from the memory cell is completed.

11. The semiconductor storage device according to claim 1, wherein the sense amplifier is capable of arbitrarily selecting between:

a first sensing manner for passing an electric current to the third node from the bit line through the first transistor and the third transistor and thereafter passing an electric current to the third node from the sense node through the second transistor and the third transistor during reading from the memory cell; and a second sensing manner for making a voltage of the second node stable and thereafter passing an electric current to the bit line from the sense node through the second transistor and the first transistor during reading from the memory cell.

12. The semiconductor storage device according to claim 1, further comprising a voltage adjustment circuitry configured to adjust a voltage at the third node.

13. The semiconductor storage device according to claim 12, wherein the voltage adjustment circuitry raises the voltage at the third node in a case where an ambient temperature rises.

14. The semiconductor storage device according to claim 12, wherein the voltage adjustment circuitry raises the voltage at the third node higher as a distance from the memory string to be read out and the sense amplifier becomes longer.

15. The semiconductor storage device according to claim 12, wherein the voltage adjustment circuitry raises the voltage at the third node higher as a threshold of the third transistor becomes lower.

16. The semiconductor storage device according to claim 12, further comprising a reference voltage generation circuitry configured to generate a reference voltage serving as a reference for the voltage at the third node, wherein the voltage adjustment circuitry controls feedback such that the voltage at the third node matches the reference voltage.

17. The semiconductor storage device according to claim 16, wherein the reference voltage generation circuitry includes:

an electric current source configured to generate an electric current in accordance with an electric current flowing to the memory string to be read out;

a resistance replica circuitry connected on an electric current path of the electric current source and having a resistance value in accordance with a resistance value of the bit line;

a diode replica circuitry connected between one end of the resistance replica circuitry and an output node of the reference voltage and simulating an electrical property of the third transistor; and a feedback control circuitry configured to control feedback such that a voltage at a connection node between the electric current source and the resistance replica circuitry matches a predetermined threshold voltage.

18. The semiconductor storage device according to claim 17, wherein
the resistance replica circuitry is a variable resistor capable of changing the resistance value depending on a distance from the memory string to be read out and the sense amplifier.

19. A memory system comprising:
a semiconductor storage device having a memory string including a memory cell; a bit line electrically connected to one end of the memory string; a sense amplifier electrically connected to the bit line; and an internal controller configured to control the operation of the sense amplifier, in which the sense amplifier comprises: a first transistor, one end of which is connected to a first node on an electric current path of the bit line, and another end of which is electrically connected to a second node; a second transistor electrically connected between the second node and a sense node; and a third transistor, a gate of which is connected to the first node, and which third transistor is electrically connected between the second node and a third node whose voltage can be adjusted; and
an external controller configured to control data writing to the semiconductor storage device and data reading from the semiconductor storage device, wherein
based on an instruction from the external controller, the internal controller selects one of a first sensing manner for passing an electric current to the third node from the bit line through the first transistor and the third transistor and thereafter passing an electric current to the third node from the sense node through the second transistor and the third transistor during reading from the memory cell and
a second sensing manner for making a voltage of the second node stable and thereafter passing an electric current to the bit line from the sense node through the second transistor and the first transistor during reading from the memory cell.

20. The memory system according to claim 19, wherein the external controller instructs the semiconductor storage device to select the first sensing manner or the second sensing manner using a prefix command, bit value setting through Set Feature, or a parameter set.

* * * * *